United States Patent [19]
Azdasht et al.

[11] Patent Number: 6,043,985
[45] Date of Patent: Mar. 28, 2000

[54] THERMAL CONNECTING STRUCTURE FOR CONNECTING MATERIALS WITH DIFFERENT EXPANSION COEFFICIENTS

[75] Inventors: Ghassem Azdasht; Paul Kasulke; Habib Badrihafifekr; Stefan Weiss, all of Berlin; Elke Zakel, Falkensee, all of Germany

[73] Assignee: Fraunhofer-Gesellschaft zur Forderung der angewandten Forschung e.V., Munich, Germany

[21] Appl. No.: 08/965,877

[22] Filed: Nov. 7, 1997

[30] Foreign Application Priority Data

Nov. 11, 1996 [DE] Germany .............. 196 46 476

[51] Int. Cl.⁷ ............................ H05K 7/20
[52] U.S. Cl. .................. 361/707; 174/252; 361/719
[58] Field of Search ................ 165/80.3, 185; 174/16.3, 252, 266; 257/686, 706, 707, 773, 737, 738, 778; 361/704, 707–710, 713, 768, 717–719, 770, 774, 777

[56] References Cited

U.S. PATENT DOCUMENTS

| | | | |
|---|---|---|---|
| 5,591,941 | 1/1997 | Acocella | 174/266 |
| 5,640,051 | 6/1997 | Tomura | 257/778 |
| 5,672,542 | 9/1997 | Schwiebert | 437/183 |
| 5,764,485 | 6/1998 | Lebaschi | 361/774 |
| 5,773,884 | 6/1998 | Andros | 361/749 |
| 5,808,874 | 9/1998 | Smith | 361/774 |

FOREIGN PATENT DOCUMENTS 1 141 029 12/1962 Germany .
30 31 912 1/1982 Germany ............. H05K 7/20

OTHER PUBLICATIONS

Gupta, Debabrata A Novel Active Area Bumped Flip Chip Technology for Convergent Heat Transfer from Gallium Arsenide Power Devices, IEEE Transactions on Components, Packaging, and Manufacturing Technology, Part A. vol. 18, No. 1, Mar. 1995 Derwent Abstract corresponding to DE 30 31 912.

Primary Examiner—Gerald Tolin
Attorney, Agent, or Firm—Darby & Darby

[57] ABSTRACT

A connecting structure (23) for establishing a thermal connection between at lest two components (21, 22) composed of materials with different expansion coefficients, wherein at least one component forms an electronic power element (21) and higher-melting-point materials are used for the contacting, which higher-melting-point materials form isolated connecting elements (29) between the contact surfaces (27, 28) of the components (21, 22).

7 Claims, 3 Drawing Sheets

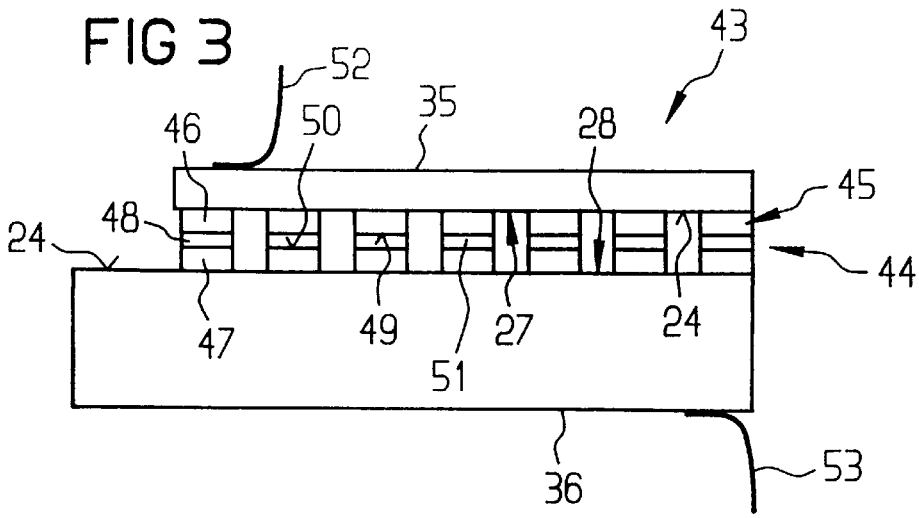
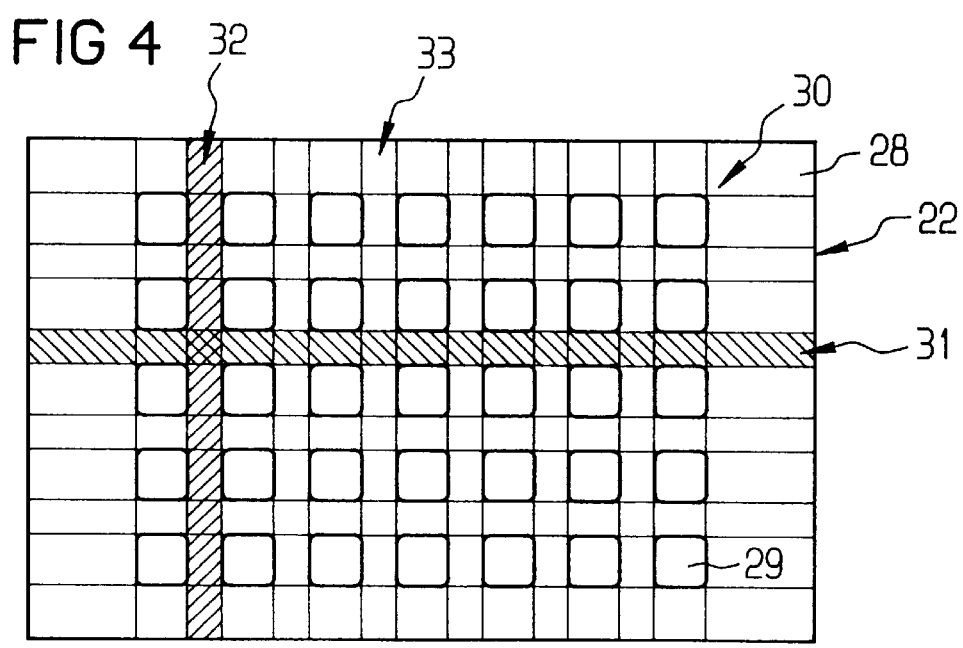
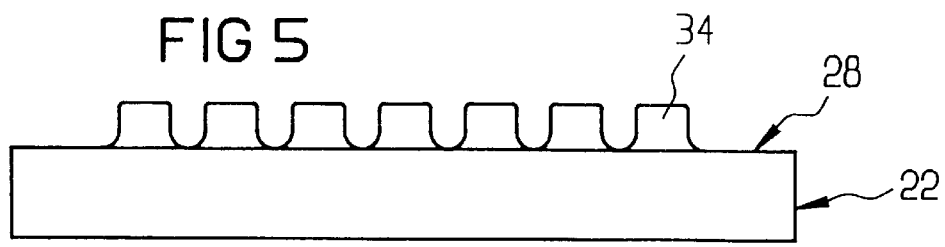

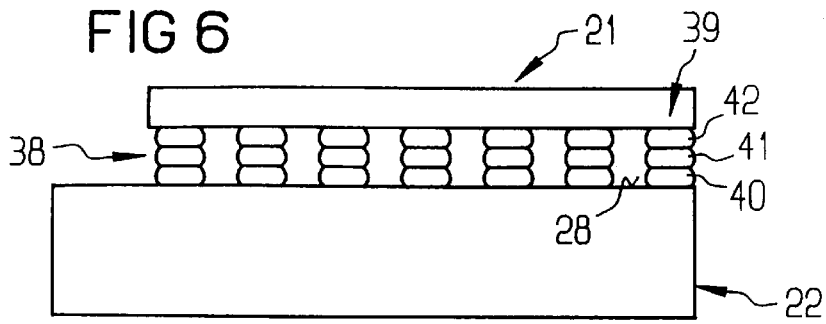
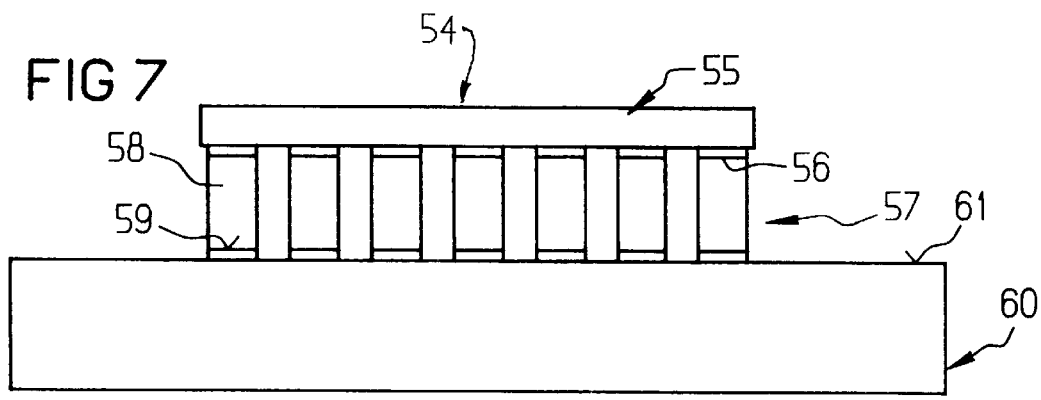
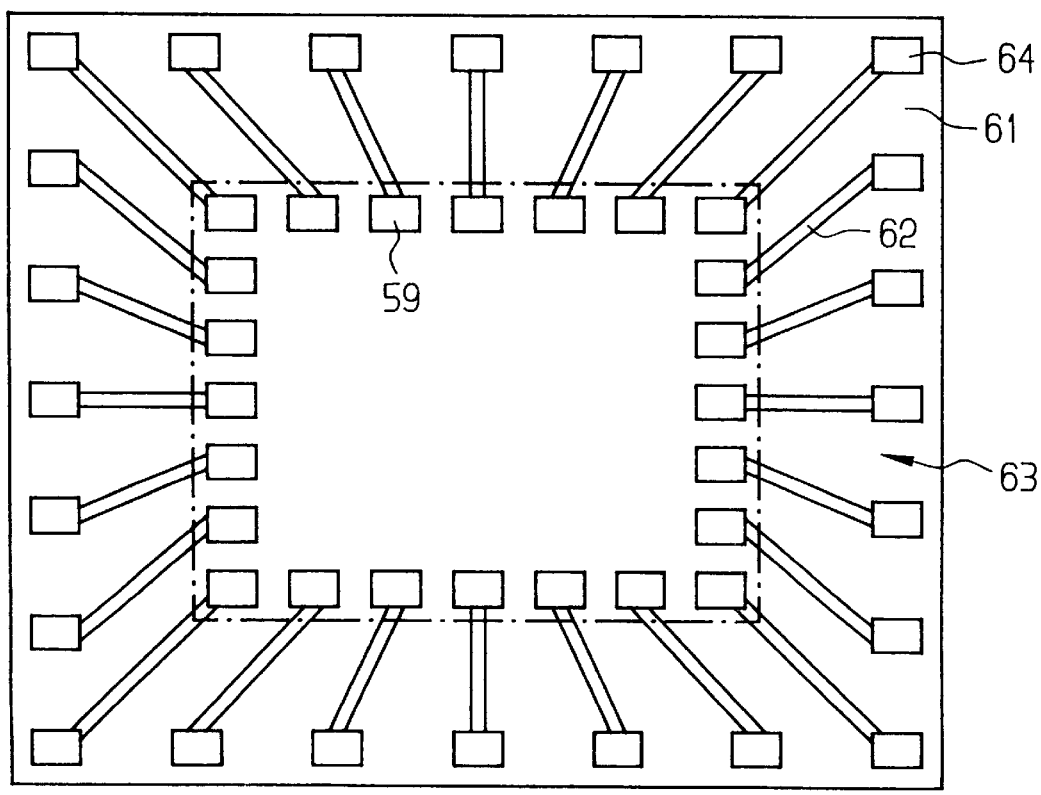

THERMAL CONNECTING STRUCTURE FOR CONNECTING MATERIALS WITH DIFFERENT EXPANSION COEFFICIENTS

The present invention relates to a connecting structure for thermally connecting at least two components composed of materials with different expansion coefficients, at least one component forming an electronic power element.

During operation electronic power elements, such as for example laser diodes, develop a high dissipation power which is converted into heat. To ensure the reliability of the component it is necessary to discharge this heat. For this purpose it is known to mount such power elements on so-called "heat spreaders" or coolers. The heat spreaders or coolers generally represent substrates which, due to their material properties, are particularly suitable as heat sinks for the withdrawal of the heat from the power element. The thermal conduction from the power element to such a substrate in the past has taken place via a soft, low-melting solder material, such as for example indium solder, which due to its low mechanical yield point in the connection zone facilitates a breaking down of the mechanical tensions caused by the different thermal expansion coefficients of the power element and the substrate.

For the establishment of the connection, the indium solder is applied to the surface of the substrate in the form of a continuous layer of solder material and the power element is contacted by its surface on the solder material layer in accordance with the "die bond" technique. The know use of indium solder for contacting between a power element and a substrate serving as heat sink can thus prevent damage to the power element due to thermally induced mechanical tensions. However, these advantageous mechanical properties of the indium solder, which facilitate a breaking down of tensions in the connecting arrangement between the power element and the substrate must be contrasted with the considerable disadvantage of this solder material's lack of resistance to ageing. In practice this leads to a situation in which, for example in the case of opto-electronic assemblies comprising a laser diode contacted on a cooling substrate, component failure occurs even after a relatively short operating time of frequently less than 5,000 hours.

Therefore the object of the present invention is to propose a connecting structure of the type referred to in the introduction which permits a reliable breakdown of thermally induced tensions between the components without disadvantageously affecting the life of the power element.

This object is achieved by a connecting structure having the features of claim 1.

In accordance with the invention, higher-melting-point connecting materials are used to produce the connecting structure, which materials form isolated connecting elements between the contact surfaces of the components.

The invention is based on the principle that improved life and reliability of assemblies composed of the aforementioned different components is basically possible only by the use of higher-melting-point connecting materials. As, in the case of a metal, the property of a high melting point is always physically coupled with the feature of a correspondingly high mechanical yield point, in the connecting arrangement according to the invention this property, in itself negative in terms of the intended purpose of the use of the connecting material, is compensated by a special design of the connecting structure between the components to be connected to one another. By virtue of the formation of isolated connecting elements, the known connecting structure in the form of a continuous solder layer is replaced by a connecting structure broken up into individual connecting elements of relatively flexible shape. Due to the isolated arrangement of the connecting elements in accordance with the invention, said connecting elements are independent of one another in terms of their deformation behaviour so that the support effect, which is disadvantageous as regards the breaking down of tensions and which is observable in the known solder material applied in the form of a continuous layer, is not present.

In accordance with an advantageous embodiment of the connecting structure, the connecting structure is composed of connecting elements which are in each case constructed from a uniform connecting material and are directly connected to the contact surfaces of the components. A particularly suitable material for such connecting elements is gold, which can be directly connected to the contact surfaces of the components formed for example by a gold or tin metallization. Such a connection can be established by means of thermocompression bonding, known per se, in the case of which the components to be connected to one another are subjected to pressure and heat from their rear sides facing the contact surfaces.

The construction of the connecting structure from isolated connecting elements can take place using all known processes, such as for example electro-deposition or other deposition processes, vapour deposition or sputtering, or also mechanical production processes. Examples of mechanical production processes to be mentioned here are the formation of connecting columns or ribs from a connecting material applied to the entire surface by appropriate material processing or known stack bonding techniques in which a plurality of ball bonds are stacked on above another to form a colum-like stack.

If the connecting elements for the contacting of mutually opposed contact, surfaces comprise an intermediate layer composed of a solder material, it is also possible to use a soldering process to form the connecting structure instead of the above described thermocompression bonding. As the connecting elements are in each case available in their entirety for the breaking down of the thermal tensions, it is possible to use a higher- or high-melting solder, such as for example an AuSn solder, as solder material.

The solder material can be applied to one of the mutually opposed contact surfaces or also to one of two sub-portions of the connecting elements in each case previously applied to one of two mutually opposed contact surfaces.

In a preferred embodiment of the connecting structure, the surface of the power element facing the further component serves as contact surface for connection with the surface of the further component which forms the opposite contact surface, in such manner that the connecting elements are arranged between the surfaces of the components and the connection between the components can take place in accordance with the "die bond" technique.

In the case of such a connection between the components, in addition to their heat conducting function the connection elements in their entirety can also form an electric contact between the power element and the further component.

Additionally however, the possibility exists of using the individual connecting elements of the connecting structure to electrically connect mutually insulated, isolated contact surfaces of the power element to correspondingly isolated contact surfaces of the further component. Such as connection corresponds to a "flip-chip connection" known per se in which the chip is contacted by its terminal surfaces in a covering layer with corresponding terminal surfaces of a substrate on that substrate. In this way, in the case of an appropriate formation of the substrate serving as heat sink, it is possible simultaneously to use said substrate for the re-wiring of the chip terminal surfaces.

A particularly advantageous possible use of the chip structure is in an opto electronic assembly comprising a laser element, for example a laser bar, and a cooling substrate, where the surface of the laser element provided with a contact metallization is connected via a plurality of connecting elements to the surface of the cooling substrate, which is likewise provided with a contact metallization, and the cooling substrate serves simultaneously as electric contact device.

Another advantageous use of the connecting structure is in an IC assembly comprising a power element in the form of a chip or chip unit and a further component in the form of a heat sink device, where the terminal surfaces of the chip or chip unit are connected via a plurality of connecting columns or connecting ribs to electric terminal surfaces of the heat sink device and the cooling substrate serves simultaneously for there-wiring of the terminal surfaces of the chip or chip unit.

In the following preferred embodiments and uses of the connecting structure will be explained in detail making reference to the drawings in which:

FIG. 3 shows an alternative embodiment of the connecting structure illustrated in FIG. 1.

FIG. 4 is a plan view of a variant of the production of a connecting structure;

FIG. 5 is a side view of the connecting structure illustrated in FIG. 4.

FIG. 6 shows a further embodiment as an alternative of the connecting structure illustrated in FIG. 1;

FIG. 7 is a side view of a connecting structure in the case of a connection in accordance with "flip-chip" technology.

FIG. 8 is a plan view of the connecting structure illustrated in FIG. 7.

Figure 1:
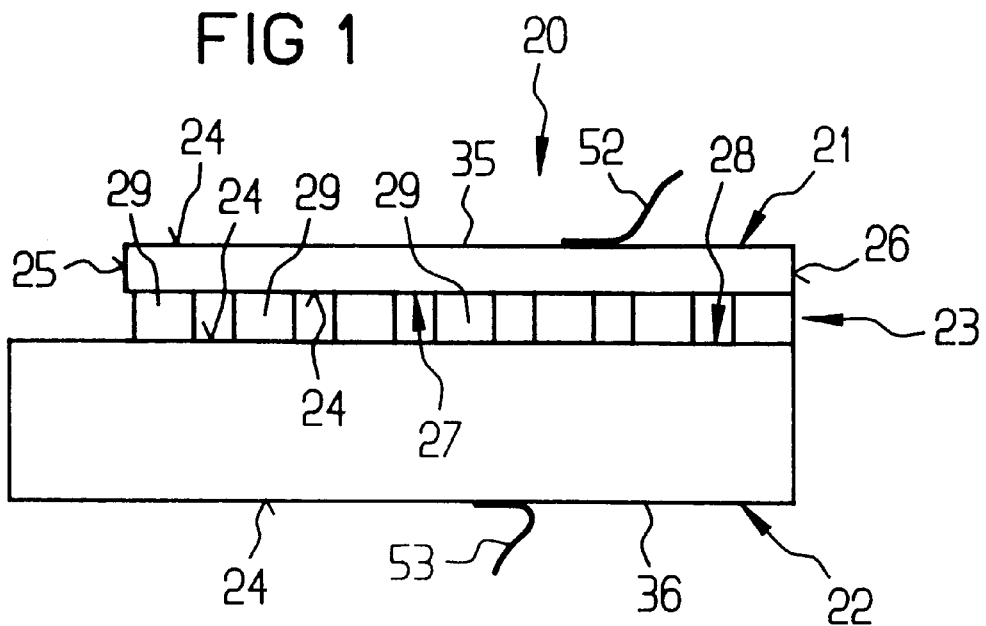
FIG. 1 is a side view of a connecting structure of a connection between a laser bar and a cooling substrate established in accordance with the "die bond" technique.

FIG. 1 shows an opto electronic assembly 20 with a laser bar 21 and a cooling substrate 22 which are connected to one another via a connecting structure 23.

The laser bar 21 shown in FIG. 1 can for example consist of an AlGaAs/GaAs alloy or an InGaAs/GaAs alloy with a surface metallization 24 of gold, said surface metallizaiton 24 covering a rear side 35 and an oppositely disposed surface 27. The laser bar 21 has end faces in the form of optical surfaces 25, 26.

In the present example the cooling substrate 22 consists of copper or diamond and at least on its surface facing towards the laser bar 21 is provided with a surface metallization 24 composed of gold.

The connecting structure 23 in the form of individual connecting columns 29 is formed between mutually opposed surfaces 27, 28 of the laser bar 21 and the cooling substrate 22. As can be seen from the illustration in FIG. 2, in the present case the connecting columns 29 are distributed in a regular arrangement over the surface 27 of the laser diode 21. For the establishment of the connection shown in FIG. 1 between the laser bar 21 and the cooling substrate 22, firstly the connecting structure 23 is formed either on the surface 27 of the laser bar 21 or on the surface 28 of the cooling substrate 22.

Following the formation of the connecting structure 23, for example on the surface 28 of the cooling substrate 22, the surface 27 of the laser bar 21 is applied to the connecting structure 23 in a manner known from the "die bond" technique and a thermocompression connection takes place in which from their rear side 35 and 36 respectively the laser bar 21 and/or cooling substrate 22 is/are subjected to pressure and heat by a suitable bonding tool. The connecting columns 29 of the connecting structure 23 are now connected view their contact surface 37, which faces towards the surface 27 of the laser bar (FIG. 2), to the surface 27 or the surface metallization 24 applied to the surface 27.

By way of example, FIGS. 4 to 6 illustrate two possibilities of forming the connecting structure 23. As will be apparent by jointly considering FIGS. 4 and 5, one possibility of producing the connecting structure 23 consists in firstly applying continuous connecting material to form an unbroken layer 30 of connecting material on the surface 27 of the laser bar 21 or, as is the case here, on the surface 28 of the cooling substrate 22. Undoubtedly, it is preferable to arrange the connecting material layer 30 on the surface 28 of the cooling substrate 22.

The connecting material layer, which in the present case consists of gold or an alloy predominantly containing gold, is then processed using suitable tools (not shown in detail here) to for longitudinally and transversely extending, groove-like or channel-like recesses 31, 32 for the construction of a uniform grid 33 as shown in FIG. 4. As can be seen from FIG. 5, the introduction of only longitudinally extending recesses 31 or transversely extending recesses 32 leads to the formation of connecting ribs 34 running in the corresponding direction on the surface 28 of the cooling substrate 22. If both longitudinally and transversely extending recesses 31, 32 are introduced into the connecting material layer 30, the connecting columns 29 illustrated in FIG. 2 are formed.

Figure 2:
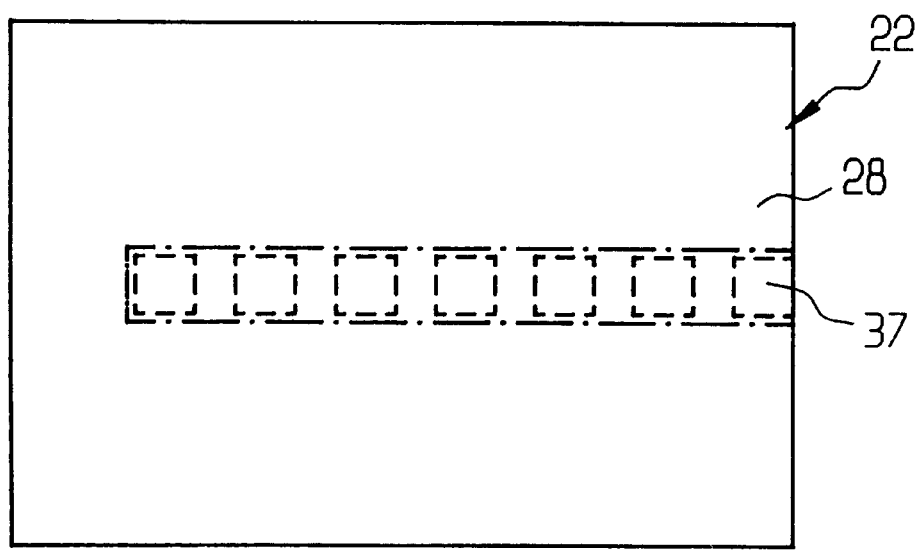
FIG. 2 is a plan view of the connecting structure illustrated in FIG. 1.

Following the preparation of the surface 28 of the cooling substrate 22 in the above described manner, the power element, which is formed by a laser bar 21 in accordance with FIGS. 1 and 2, is applied by its surface 27 to the connecting structure 23 in a manner known from the "die bond" technique and a thermocompression connection takes place in which, from their rear side 35 or 36 respectively, the laser bar 21 and/or cooling substrate 22 are subjected to pressure and heat by a suitable bonding tool.

The connecting columns 29 of the connecting structure 23 are now connected via their contact surface 37, which faces towards the surface 27 of the laser bar (FIG. 2), to the surface 27 or the surface metallization 24 applied to the surface 27.

As an alternative to the connecting structure 23 illustrated in FIG. 1, FIG. 6 shows a connecting structure 38 between the laser bar 21 and the cooling substrate 22, the connecting columns 39 of said structure 38 consisting of so called "stack bonds". For this purpose, using a wire bond capillary tube (not shown in detail here) a plurality of ball bonds 40, 41 and 42 are produced consecutively one above another, only the first ball bond 40 being produced directly on the surface 28 of the cooling substrate 22 and the following ball bonds 41, 42 in each case being arranged on the previously produced ball bond. The subsequent connection of the laser bar 21 to the cooling substrate 22 provided with the connecting structure 38 is likewise performed in accordance with the "die bond" technique.

FIG. 3 illustrates an assembly 43, the components of which correspond to the assembly 20 illustrated in FIG. 1 and which comprises a laser bar 21 and a cooling substrate 22. In contrast to the assembly 20, the assembly 43 has a connecting structure 44 composed of connecting columns 45. The connecting columns 45 in each case comprise two column sub portions 46, 47 which are connected to one another via an intermediate layer 48 of solder material.

For the production of the connecting structure 44 illustrated in FIG. 3, firstly the column sub-portions 46 and 47 are produced both on the surface 27 of the laser bar 21 and on the surface 28 of the cooling substrate 22. This can in each case take place in the same manner as in the case of the above described formation of the connecting columns 29 or 38.

Then a solder material 51 is applied to a contact surface 49 of the column sub-portions 46 or a contact surface 50 of the column sub portions 47 to form the intermediate layer 48 illustrated in FIG. 3. The production of the connecting structure 44 and thus the connection of the laser bar 21 and the cooling substrate 22 to form the assembly 43 can then take place by means of a solder material remelting process. As regards the arrangement of the solder material 51 on the column sub-portions 46 and 47, it is particularly advantageous to apply the solder material in the form of solder plates known under the term "preforms".

As can be seen form FIGS. 1 and 3, both in the case of the assembly 20 and in the case of the assembly 43 the laser bar 21 and the cooling substrate 22 are provided with an electric lead 52 and 53 respectively, the electric connection between the lead 53 and the laser bar 21 taking place via the cooling substrate 22 and the connecting structure 23.

The chip assembly 54 illustrated in FIG. 7 comprises a chip 55, the terminal surfaces 56 of which are connected via a connecting structure 57 of individual connecting columns 58 to terminal surfaces 59 of the cooling substrate 60. The cooling substrate 60 is composed of a thermally conductive, but electrically insulating material, such as for example cubic boron nitride or diamond, and as shown in FIG. 8 is provided on its surface 61 opposite the chip 55 with conductor paths 62 which here are distributed in a so-called "fan-out" arrangement and continue into a terminal surface arrangement 63 comprising terminal surfaces 64. As can be seen from FIG. 8, the terminal surfaces 64 of the terminal surface arrangement 63 are spaced from one another by a substantially larger interval than the terminal surfaces 56 of the chip 55 so that the re-wiring, which has taken place on the surface 61 of the cooling substrate 60, facilitates a simplified contacting of the chip 55.

The connecting structure 57 can also be replaced by any one of the previously explained connecting structures. For the establishment of the connection illustrated in FIG. 7, "flip chip" contacting can be performed in the case of which, in contrast to the "die bond" technique, the chip 55 is contacted on the substrate with its terminal surfaces facing the substrate in a "face down" orientation.

We claim:

1. A connection structure including at least one electronic power element and at least one cooling substrate providing at least a thermal connection between the at least one electronic power element and the at least one cooling substrate for reducing the operating temperature of the power element, the at least one electronic power element and the at least one cooling substrate each include contact surfaces connected by the connection structure, the connection structure comprises a plurality of isolated connecting elements made from high-melting-point materials having a melting point above the operating temperature of the at least one power element and wherein the plurality of isolated connecting elements are constructed of a plurality of layers.

2. The connection structure of claim 1, wherein the plurality of layers include an intermediate layer comprising solder material.

3. The connection structure of claim 1, wherein the plurality of layers include a first layer, an intermediate solder layer, and a second layer and wherein the first layer is connected to the contact surface of the at least one electronic power element and the second layer is connected to the contact surface of the at least one cooling substrate.

4. The connection structure of claim 1, wherein the at least one electronic power element comprises an electronic power element contact surface directed towards the at least one cooling substrate, the power element contact is connected with the contact surface for the at least one cooling substrate.

5. The connection structure of claim 4, wherein the electronic power element contact surface provides an electric connection.

6. An opto-electronic assembly comprising a connection structure including a thermal connection between at least one laser element and at least one cooling substrate for reducing the operating temperature of the laser element, the at least one laser element and the at least one cooling substrate having contact surfaces being connected by the connection structure, the connection structure includes a plurality of isolated connecting elements comprising a plurality of layers, at least one layer is made from high-melting point materials having a melting point above the operating temperature of the at least one laser element, the at least one cooling substrate being electrically connected to the at least one laser element by the connecting elements.

7. An IC assembly with a connection structure establishing a thermal connection between at least one chip and at least one cooling substrate for reducing the operating temperature of the chip, the at least one chip and the at least one cooling substrate having contact surfaces being electrically connected via the connection structure, the connection structure being composed of a plurality of isolated connecting elements including a plurality of layers and made from high-melting-point materials having a melting point above the operating temperature of the at least one chip, the contact surfaces of the at least one cooling substrate being connected to terminal surfaces on the at least one cooling substrate and forming a wiring arrangement.

* * * * *